United States Patent
Carminati

(10) Patent No.: US 9,864,187 B2
(45) Date of Patent: Jan. 9, 2018

(54) MICROMECHANICAL STRUCTURE WITH BIAXIAL ACTUATION AND CORRESPONDING MEMS DEVICE

(71) Applicant: STMicroelectronics S.r.l., Agrate Brianza (IT)

(72) Inventor: Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/162,885

(22) Filed: May 24, 2016

(65) Prior Publication Data
US 2017/0153443 A1    Jun. 1, 2017

(30) Foreign Application Priority Data
Nov. 30, 2015   (IT) .................. 102015000078393

(51) Int. Cl.
*G02B 26/08* (2006.01)
*B81B 3/00* (2006.01)
*G03B 21/00* (2006.01)

(52) U.S. Cl.
CPC ........ *G02B 26/0833* (2013.01); *B81B 3/0083* (2013.01); *G03B 21/008* (2013.01); *B81B 2201/042* (2013.01)

(58) Field of Classification Search
CPC .. G02B 26/085; G02B 26/10; G02B 26/0833; G02B 26/0841; B81B 3/0083; G03B 21/008

USPC ....................................................... 359/221.2
See application file for complete search history.

(56) References Cited

U.S. PATENT DOCUMENTS

| | | | |
|---|---|---|---|
| 7,399,652 B2 | 7/2008 | Sassolini et al. | |
| 2006/0181756 A1 | 8/2006 | Yamazaki | |
| 2013/0308173 A1 | 11/2013 | Muchow et al. | |
| 2014/0232993 A1 | 8/2014 | Kim | |
| 2015/0260847 A1* | 9/2015 | Sromin ................ | G02B 26/085 359/199.3 |

OTHER PUBLICATIONS

IT Search Report and Written Opinion for IT 102015000078393 dated Jul. 22, 2016 (10 pages).

* cited by examiner

*Primary Examiner* — Euncha Cherry
(74) *Attorney, Agent, or Firm* — Gardere Wynne Sewell LLP

(57) ABSTRACT

A reflector micromechanical structure includes a frame with a window. The frame is elastically connected to an anchorage structure by first elastic elements. An actuation structure operatively coupled to the frame is configured to generate a first actuation movement of the frame about a first actuation axis. A mobile mass is positioned within the window and elastically coupled to the frame by second elastic elements. A mass distribution is associated to the mobile mass such as to generate, by an inertial effect in response to the first actuation movement, a second actuation movement of rotation of the mobile mass about a second actuation axis.

29 Claims, 8 Drawing Sheets

MICROMECHANICAL STRUCTURE WITH BIAXIAL ACTUATION AND CORRESPONDING MEMS DEVICE

PRIORITY CLAIM

This application claims priority from Italian Application for Patent No. 102015000078393 filed Nov. 30, 2015, the disclosure of which is incorporated by reference.

TECHNICAL FIELD

The present invention relates to a micromechanical structure with biaxial actuation and to a corresponding MEMS (Micro-Electromechanical Systems) device; in particular, the present disclosure will refer to a reflector micromechanical structure (also referred to as "micromirror") for an optical MEMS device, for example a projector.

BACKGROUND

Reflector micromechanical structures are known, that are made, at least in part, with semiconductor materials and using MEMS technology.

These micromechanical structures may be integrated in portable electronic apparatuses, such as for example tablets, smartphones, PDAs, for optical applications, in particular for directing, with desired modalities, beams of light radiation generated by a light source, typically a laser. Thanks to the reduced dimensions, micromechanical structures enable stringent requirements to be met as regards occupation of space, in terms of area and thickness.

For instance, reflector micromechanical structures are used in miniaturized projector devices (the so-called pico-projectors), which are able to project desired images or patterns of light at a distance.

Reflector micromechanical structures generally include a mobile structure, which carries a reflecting element or mirror element (i.e. of a material having a high reflectivity for a particular wavelength, or band of wavelengths), made in a body of semiconductor material so as to be mobile, for example with a movement of inclination and/or rotation, for directing an incident light beam in a desired way by varying a direction of propagation thereof; and a supporting structure, which is also made starting from a body of semiconductor material, coupled to the mobile structure, having functions of supporting and handling. In the supporting structure, a cavity is generally formed, underneath and in a position corresponding to the mobile structure with its reflecting element, for enabling freedom of movement and rotation thereof.

Typically, the direction of propagation of the optical beam is varied in a periodic or quasi-periodic way for performing a scanning of a portion of space with the reflected optical beam. In particular, in reflector micromechanical structures of a resonant type, an actuation system causes oscillation of the reflecting element in a substantially periodic way about a resting position, the oscillation period being as close as possible to the resonance frequency in order to maximize the angular distance covered by the reflecting element during each oscillation and thus maximize the size of the scanning space portion.

Among reflector micromechanical structures, biaxial-actuation structures are known, in which the reflecting element is actuated with respect to two different mutually orthogonal actuation axes according to a so-called Lissajous scanning path.

FIG. 1 illustrates in a schematic and simplified manner a reflector micromechanical structure, designated as a whole by 1.

The reflector micromechanical structure 1 comprises: a frame 2, in the example shown having a square ring shape in a horizontal plane xy defined by a first horizontal axis x and a second horizontal axis y (and coinciding with the plane of a main surface 2A of the same frame 2); and a mobile mass 4, in the example shown having a circular shape in the horizontal plane xy.

The frame 2 defines, inside it, a window 5, in which the mobile mass 4 is housed, and is connected by first elastic elements 6 to an anchorage structure 7, external to the same frame 2, fixed with respect to a substrate 8 (represented schematically) of the body of semiconductor material in which the reflector micromechanical structure 1 is provided.

In particular, the first elastic elements 6 extend aligned along the first horizontal axis x, on opposite sides of the frame 2, connecting respective portions of the frame 2 to anchoring elements 7A, 7B of the anchorage structure 7 (that are, for example, in a way herein not illustrated, vertical pillars that connect to the aforesaid substrate 8).

The first elastic elements 6 are compliant to torsion for enabling a movement of rotation of the frame 2 with respect to the anchorage structure 7 and to the substrate 8, out of the horizontal plane xy and about the first horizontal axis x.

The mobile mass 4 carries, at the top, a mirror element 4', of a material with high reflectivity for the light radiation to be reflected, such as, for example, aluminum or gold, and is connected to the frame 2 by second elastic elements 9, which extend aligned along the second horizontal axis y, on opposite sides of the mobile mass 4.

The second elastic elements 9 are compliant to torsion for enabling a movement of rotation of the mobile mass 4 with respect to the frame 2, out of the horizontal plane xy and about the second horizontal axis y; further, the second elastic elements 9 are rigid with respect to bending, so that the mobile mass 4 is rigidly coupled to the frame 2 in the movement of rotation about the first horizontal axis x.

The reflector micromechanical structure 1 further comprises: a first actuation structure 10 (represented schematically) coupled to the frame 2 and configured to cause an actuation movement of rotation of the same frame 2 about the first horizontal axis x, as a function of appropriate electrical driving signals such as to generate a twisting moment $T_x$ about the first horizontal axis x; and a second actuation structure 11 (which is also represented schematically), coupled to the mobile mass 4 and configured to cause a respective actuation movement of rotation of the same mobile mass 4 about the second horizontal axis y, as a function of further electrical driving signals, such as to generate a respective twisting moment $T_y$ about the aforesaid second horizontal axis y.

The first and second actuation structures 10, 11, as a function of the respective electrical driving signals, thus enable rotation of the mobile mass 4, and the associated mirror element 4', about the first and second horizontal axes x, y, in this way enabling creation of a desired biaxial scanning pattern of the reflected light beam.

So far the following principles of operation have been proposed for the aforesaid first and second actuation structures 10, 11: electrostatic (in which respective sets of comb-fingered electrodes are coupled to the frame 2 and to the mobile mass 4, for generation of electrostatic attraction forces and generation of the aforesaid twisting moments $T_x$, $T_y$); piezoelectric (in which piezoelectric elements are mechanically coupled to the first and second elastic elements 6, 9 to cause torsion thereof and consequent generation of the twisting moments $T_x$, $T_y$); and electromagnetic (a coil is in this case arranged in a position corresponding to the frame 2 for generating, due to passage of an electric current, a magnetic field designed to generate the twisting moments $T_x$, $T_y$).

An example of a reflector micromechanical structure operating according to the electrostatic principle is, for example, described in U.S. Pat. No. 7,399,652 (incorporated by reference).

It has been noted that the solution described previously, irrespective of the principle of actuation used, is affected by certain limitations as regards the efficiency of actuation and the size of the resulting structure.

In particular, high values of the driving signals are generally to be supplied to the actuation structures to obtain the desired twisting moments $T_x$, $T_y$, for example high voltages of the order of 100 V for electrostatic actuation structures, or of 50 V for piezoelectric actuation structures, or high currents, for example of the order of 100 mA, in the case of electromagnetic actuation structures.

This problem is evidently more felt for biaxial-actuation micromechanical structures, where generally distinct driving circuits and actuation structures are required for each axis of actuation (with a consequent increase in the size and the manufacturing costs).

There is a need in the art to solve, at least in part, the above problems, which afflict micromechanical structures of a known type, and in particular to provide a structure with an improved actuation efficiency.

SUMMARY

In an embodiment, a micromechanical structure with biaxial actuation comprises: a frame including an internally defined window, said frame elastically connected by first elastic elements to an anchorage structure fixed with respect to a substrate; an actuation structure operatively coupled to said frame and configured to generate a first actuation movement of said frame with respect to a first actuation axis for said frame; a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass, and a mass distribution associated to said mobile mass and being asymmetrical at least with respect to said second actuation axis and configured to generate, by an inertial effect as a function of said first actuation movement, a second actuation movement of rotation of the mobile mass about the second actuation axis.

In an embodiment, a MEMS device of an optical type comprises: a micromechanical structure with biaxial actuation, comprising: a frame including an internally defined window, said frame elastically connected by first elastic elements to an anchorage structure fixed with respect to a substrate; an actuation structure operatively coupled to said frame and configured to generate a first actuation movement of said frame with respect to a first actuation axis for said frame; a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass, wherein said mobile mass carries a reflecting element, and a mass distribution associated to said mobile mass and being asymmetrical at least with respect to said second actuation axis and configured to generate, by an inertial effect as a function of said first actuation movement, a second actuation movement of rotation of the mobile mass about the second actuation axis; and a light source configured to generate a light beam incident on said reflecting element; wherein biaxial actuation of said mobile mass generates a movement of said reflecting element for reflection of said light beam.

In an embodiment, a micromechanical structure with biaxial actuation comprises: a frame including a window, said frame elastically connected to an anchorage structure by first elastic elements; an actuation structure operatively coupled to said frame and configured to generate a first actuation movement of said frame with respect to a first actuation axis; a mobile mass within said window and elastically coupled to said frame by second elastic elements defining a second actuation axis; a mass distribution associated to said mobile mass in an asymmetrical manner with respect to said second actuation axis and configured to generate by the inertial effect in response to said first actuation movement a second actuation movement of rotation of the mobile mass about the second actuation axis.

BRIEF DESCRIPTION OF THE DRAWINGS

For a better understanding of the present invention, preferred embodiments thereof are now described, purely by way of non-limiting example and with reference to the attached drawings, in which.

DETAILED DESCRIPTION

Figure 1:
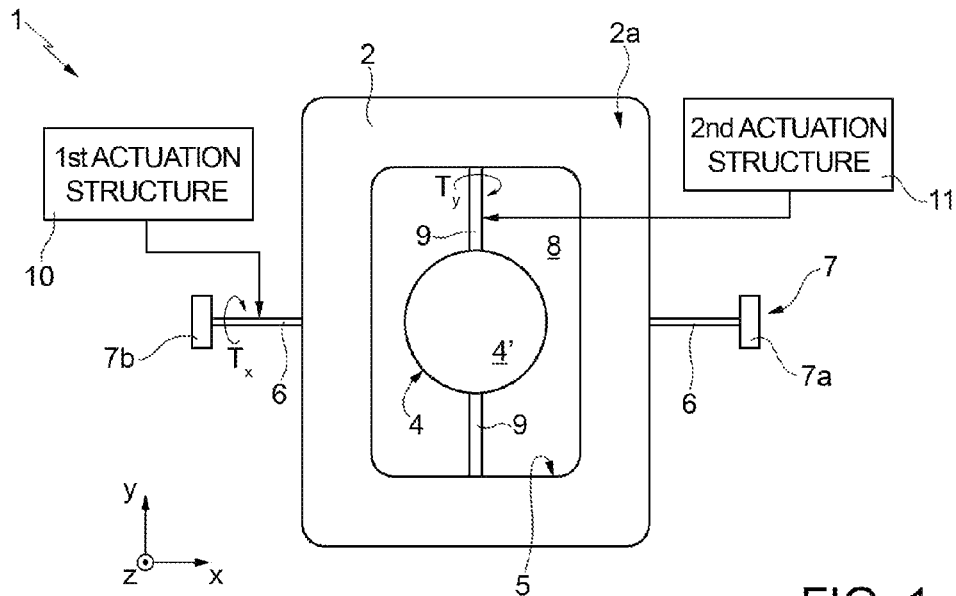
FIG. 1 is a schematic top plan view of a micromechanical structure with biaxial actuation.

As illustrated schematically in FIG. 2A, according to one embodiment of the present solution, a micromechanical structure with biaxial actuation, in particular a reflector micromechanical structure 20, has a configuration substantially equivalent to the one discussed with reference to FIG. 1, thus having: the frame 2 (in general, the same reference numbers are used for designating elements having a structure and a function equivalent to those of others discussed previously), elastically coupled to the anchorage structure 7 by the first elastic elements 6; and the mobile mass 4, which is arranged in the window 5 defined within the frame 2, carries the mirror element 4' and is elastically coupled to the same frame 2 by the second elastic elements 9.

As described previously, the first elastic elements 6, of a torsional type, are configured to enable the rotation movement of the frame 2 with respect to the anchorage structure 7 and to the substrate 8 of the body of semiconductor material in which the reflector micromechanical structure 20 is made; the rotation being out of the horizontal plane xy and about the first horizontal axis x.

Furthermore, the second elastic elements 9, which are also of a torsional type, are configured to enable the rotation movement of the mobile mass 4 with respect to the frame 2, out of the horizontal plane xy and about the second horizontal axis y; the same second elastic elements 9 are configured to rigidly couple the mobile mass 4 to the frame 2, in the actuation movement of rotation of the same frame 2 about the first horizontal axis x.

According to a particular aspect of the present solution, a distribution of mass is associated to the mobile mass 4, that is specifically designed for generating, by the inertial effect, a twisting moment, again designated by $T_y$, about the second horizontal axis y in response to the rotation of the frame 2 (and of the same mobile mass 4) about the first horizontal axis x.

Figure 2A:
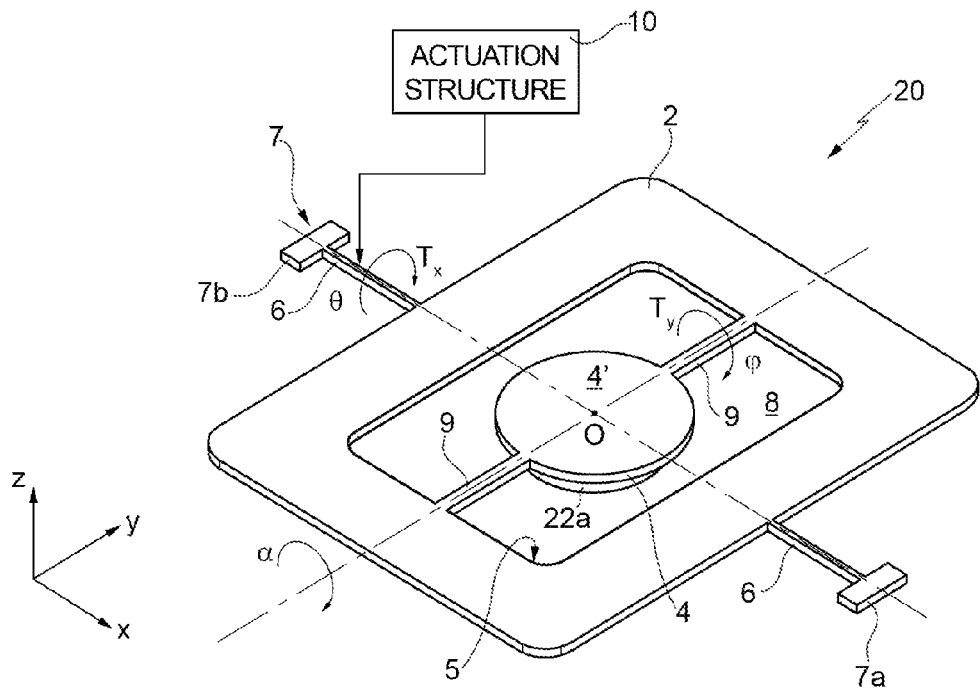
FIG. 2A is a schematic top perspective view of a micromechanical structure with biaxial actuation.

Consequently, the reflector micromechanical structure 20 may comprise in this case a single actuation structure (coinciding with the first actuation structure 10 represented in FIG. 1, and for this reason designated by the same reference number). The actuation structure 10 is coupled to the frame 2 and configured to cause its actuation movement, in this case a movement of rotation, about the first horizontal axis x, as a function of suitable electrical driving signals, for generating the twisting moment $T_x$ about the same first horizontal axis x.

Thanks to the aforesaid inertial coupling, it is not required (and thus it may advantageously not be present) a further and distinct actuation structure, coupled to the mobile mass 4 to cause rotation thereof about the second horizontal axis y (this rotation is in fact generated by inertial force coupling).

Figure 2B:
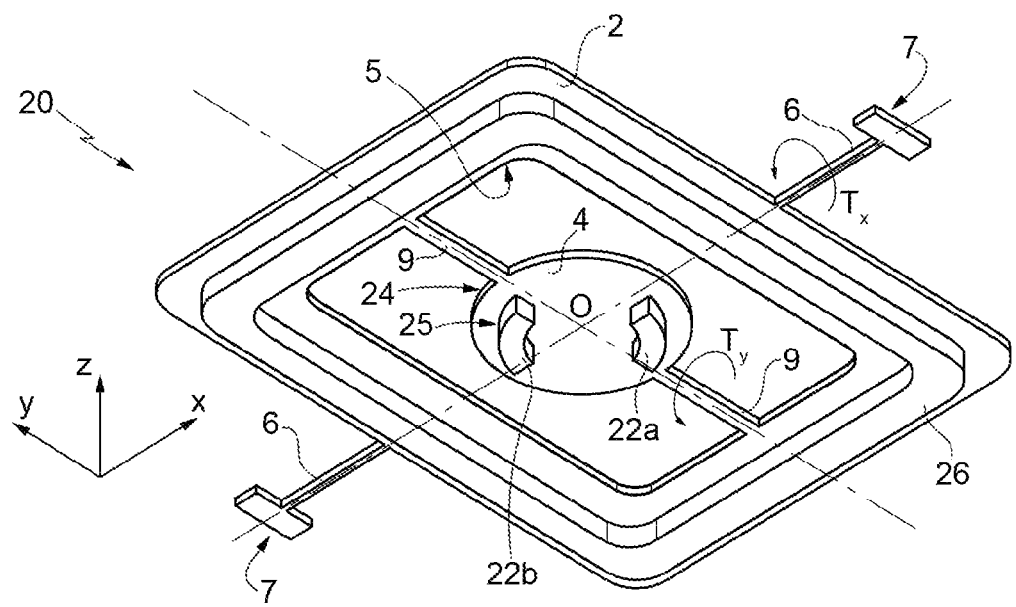
FIG. 2B is a schematic bottom perspective view of the micromechanical structure of FIG. 2A.
Figure 2C:
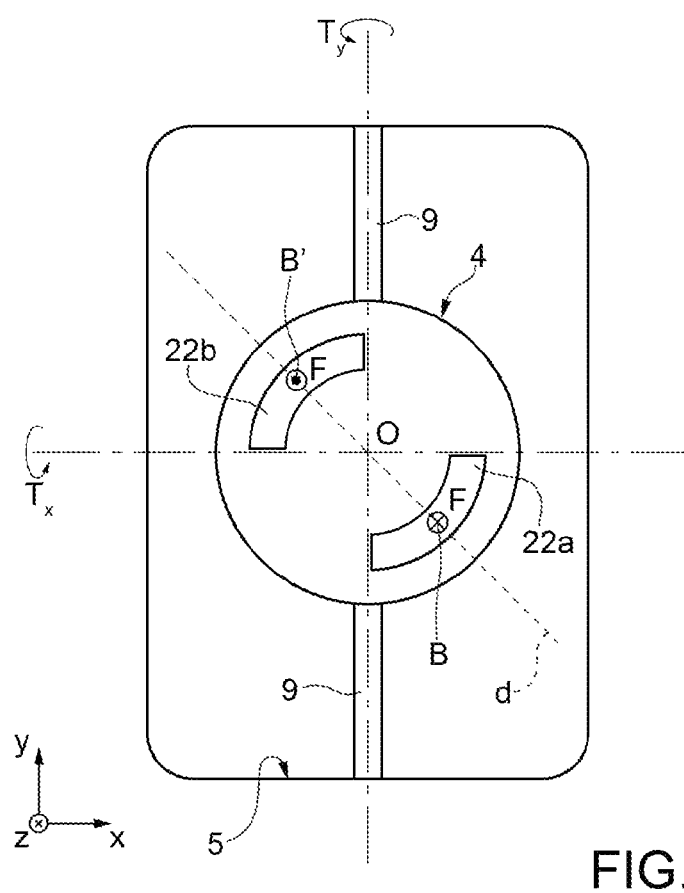
FIG. 2C is a schematic bottom plan view of a portion of the micromechanical structure of FIG. 2A.

In particular, and as illustrated for example in FIGS. 2B-2C, the mass distribution of the mobile mass 4 is asymmetrical in the horizontal plane xy, with respect to at least one, or both, of the horizontal axes x, y (i.e., to the axes of rotation of the mobile mass 4).

According to an aspect of the present solution, the mass distribution of the mobile mass 4 is asymmetrical with respect at least to the second horizontal axis y, i.e., to the axis of rotation of the same mobile mass 4.

As illustrated schematically in the aforesaid FIGS. 2B and 2C, the mobile mass 4 is ideally divided, in the horizontal plane xy, into four quadrants by the horizontal axes x and y, which cross at a geometrical center O of the mobile mass 4.

In a possible embodiment, additional mass portions 22a, 22b are associated to the mobile mass 4, arranged in opposite quadrants (in the example, the second and fourth quadrants) with respect to the geometrical center O.

The above additional mass portions 22a, 22b have respective centroids B, B' arranged at a distance from the horizontal axes x, y, which are symmetrical with respect to the geometrical center O and are aligned in a diagonal direction d, inclined (for example by 45°) with respect to the horizontal axes x, y.

The additional mass portions 22a, 22b are, in the example, shaped like a circular-ring portion (in the example, having a 90° angular extension).

Rotation of the mobile mass 4 about the first horizontal axis x (as a result of the coupling to the frame 2, which is suitably driven to obtain its actuation) generates an inertial force F on the same mobile mass 4, which, applied at the respective centroids B, B' (in opposite directions with respect to the horizontal plane xy), gives rise to the twisting moment $T_y$ about the second horizontal axis y.

The use of an asymmetrical mass distribution for the mobile mass 4 creates diagonal terms in the mass-coupling matrix of the mechanical system, thus creating a transfer of force between the first and second horizontal axes x, y, which are otherwise independent of one another (thus coupling, by the inertial effect, i.e. through the mass matrix, the horizontal axes x, y).

In particular, a "diagonal" mass distribution, of the type described previously, has been found to generate a greater transfer of force between the horizontal axes x, y.

In greater detail, and with reference once again to FIG. 2A, the angle of rotation of the frame 2 (and of the mobile mass 4 coupled thereto) about the first horizontal axis x is denoted by θ, the angle of rotation of the mobile mass 4 (and of the associated mirror element 4') about the second horizontal axis y is denoted by φ, and the angle of rotation of the frame 2 about the aforesaid second horizontal axis y is denoted by α.

It is considered, in fact, that the first elastic elements 6 are not altogether rigid to torsion with respect to the second horizontal axis y; in other words, the frame 2 may rotate, albeit in a limited way, due to the higher stiffness of the same first elastic elements 6, also about the second horizontal axis y.

Using Lagrangian mechanical theory, it is possible to obtain the following equation of motion for the system of the reflector micromechanical structure 20:

$$M\frac{d^2}{dt^2}\vec{q}(t) + B\frac{d}{dt}\vec{q}(t) + K\vec{q}(t) = \vec{T}(t)$$

$$M\frac{d^2}{dt^2}\vec{q}(t) + B\frac{d}{dt}\vec{q}(t) + K\vec{q}(t) = \vec{T}(t)$$

where $\vec{q}(t) = (\theta, \alpha, \varphi)^T$ is the vector of Lagrangian co-ordinates;
M is the mass matrix of the system;
B is the dissipation matrix of the system;
K is the stiffness matrix of the system; and
$\vec{T}(t) = (T_x, T_y, 0)^T$ is the vector of the forcing twisting moments applied to the frame 2, in particular via the actuation structure 10.

Applying the Laplace transform to the above equation, the following is obtained:

$$Ms^2\vec{q}(s) + Bs\vec{q}(s) + K\vec{q}(s) = \vec{T}(s)$$

where s=jω is the co-ordinate in the frequency domain ω (and j is the imaginary unit).

For a system with a symmetrical mass distribution for both the frame 2 and the mobile mass 4 (as in the structures according to the known art), the aforesaid equation would assume the explicit form:

$$\begin{pmatrix} J_\theta & 0 & 0 \\ 0 & J_\alpha & 0 \\ 0 & 0 & J_\varphi \end{pmatrix} s^2 \begin{pmatrix} \theta \\ \alpha \\ \varphi \end{pmatrix} + \begin{pmatrix} b_\theta & 0 & 0 \\ 0 & b_\alpha & 0 \\ 0 & 0 & b_\varphi \end{pmatrix} s \begin{pmatrix} \theta \\ \alpha \\ \varphi \end{pmatrix} + \begin{pmatrix} k_\theta & 0 & 0 \\ 0 & k_\alpha + k_\varphi & -k_\varphi \\ 0 & -k_\varphi & k_\varphi \end{pmatrix} = \begin{pmatrix} T_x \\ T_y \\ 0 \end{pmatrix}$$

where the terms J ($J_\theta$, $J_\alpha$, $J_\varphi$) are the moments of inertia, the terms b ($b_\theta$, $b_\alpha$, $b_\varphi$) are the dissipation coefficients, and the terms k ($k_\theta$, $k_\alpha$, $k_\varphi$) are the elastic constants (the subscripts intuitively indicating the degree of freedom to which the various terms refer).

From the above equation it emerges in particular that the degree of freedom θ is in this case decoupled from the other degrees of freedom, α and φ, and that, in this way, the twisting moment $T_x$ generates a response only on the degree of freedom θ, but not on the other degrees of freedom, α and φ.

Instead, in the present solution, with an asymmetrical mass distribution of the mobile mass 4 with respect to at least one, or both, of the horizontal axes x and y, the aforesaid equation assumes the form:

$$\begin{pmatrix} J_\theta & J_{\theta\alpha} & J_{\theta\varphi} \\ J_{\theta\alpha} & J_\alpha & 0 \\ J_{\theta\varphi} & 0 & J_\varphi \end{pmatrix} s^2 \begin{pmatrix} \theta \\ \alpha \\ \varphi \end{pmatrix} +$$

$$\begin{pmatrix} b_\theta & 0 & 0 \\ 0 & b_\alpha & 0 \\ 0 & 0 & b_\varphi \end{pmatrix} s \begin{pmatrix} \theta \\ \alpha \\ \varphi \end{pmatrix} + \begin{pmatrix} k_\theta & 0 & 0 \\ 0 & k_\alpha + k_\varphi & -k_\varphi \\ 0 & -k_\varphi & k_\varphi \end{pmatrix} = \begin{pmatrix} T_x \\ T_y \\ 0 \end{pmatrix}$$

where the asymmetrical mass distribution generates off-diagonal elements in the mass matrix, of inertial coupling, $J_{\theta\alpha}$ and $J_{\theta\varphi}$, which enable coupling of the equations of motion and the possibility of exploiting the twisting moment $T_x$ about the first horizontal axis x in order to excite the degree of freedom φ acting along the second horizontal axis y.

It is emphasized that the described coupling is of a dynamic type (i.e., it generally occurs as a result of resonant operation conditions); the presence of a resonant actuation about at least one of the horizontal axes x, y, in this case the first horizontal axis x, is thus generally required.

In the embodiment illustrated in the aforesaid FIGS. 2B, 2C, a body portion of the mobile mass 4, which carries the mirror element 4', is made in a surface layer 24 (of the body of semiconductor material), from which the frame 2 and the first and second elastic elements 6, 9 are also defined. The additional mass portions 22*a*, 22*b* are in this case defined starting from a structural layer 25, arranged underneath the surface layer 24 (with respect to a vertical axis z that defines a set of three Cartesian axes with the first and second horizontal axes x, y) on the side opposite to the mirror element 4', and coupled to the body portion.

As shown in FIG. 2B, from the same structural layer 25 a reinforcement portion 26 of the frame 2 may further be defined, arranged underneath the frame 2 with respect to the vertical axis z; this reinforcement portion 26 has a symmetrical mass distribution in the horizontal plane xy, having a ring shape that replicates the geometry of the frame 2.

It is in any case evident that the solution of inertial coupling previously discussed may be implemented with a wide range of different asymmetrical mass distributions for the mobile mass 4.

Figure 3A:
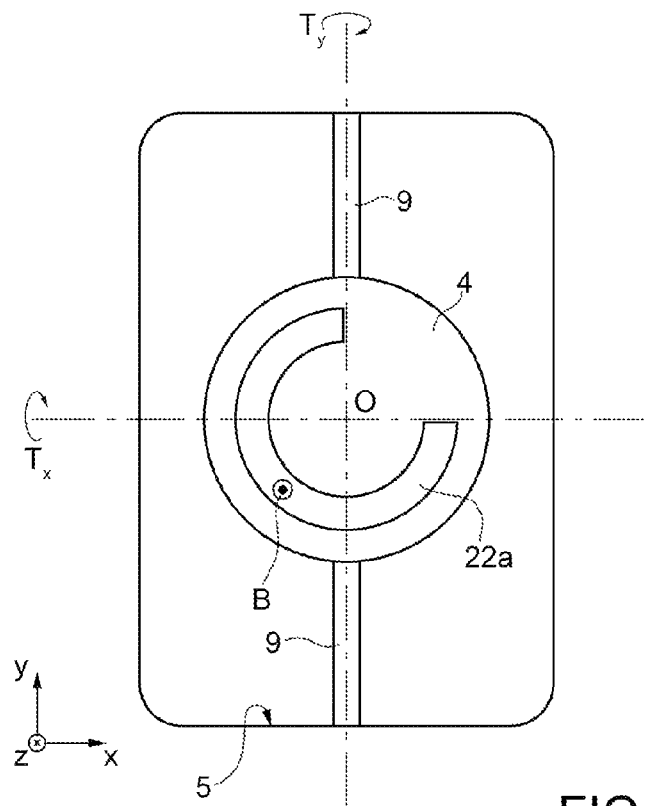
FIGS. 3A-3C show schematic bottom plan views of the portion of the micromechanical structure of FIG. 2A, according to respective embodiments.

For instance, FIG. 3A shows a possible embodiment, in which just one additional mass portion is present, designated by 22*a* (substantially C-shaped), which is asymmetrical with respect to the horizontal axes x, y extending in an incomplete circular ring over three of the four quadrants into which the mobile mass 4 is divided in the horizontal plane xy.

The additional mass portion 22*a* in this case has a centroid B located in the third quadrant, where the inertial force F due to the rotation of the mobile mass 4 about the first horizontal axis x is applied; also in this case, the above inertial force F generates a twisting moment $T_y$ about the second horizontal axis y, as will be clear from an examination of FIG. 3A.

Figure 3B:
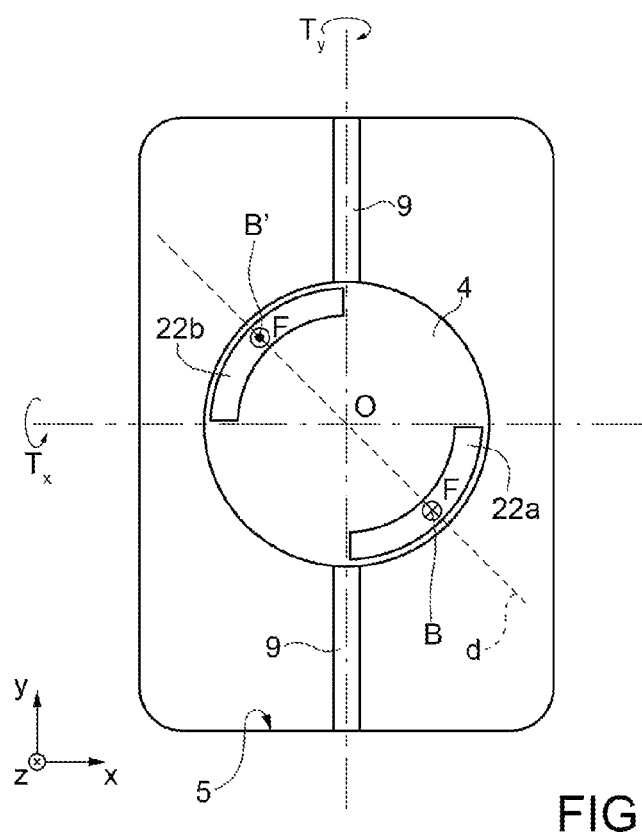

FIG. 3B shows a possible further embodiment, which differs as regards a different asymmetrical mass distribution for the mobile mass 4.

In this case, the additional mass portions 22*a*, 22*b* are located in a position that is radially more external with respect to the shape of the mobile mass 4 in the horizontal plane xy (and as compared to the embodiment of FIG. 2C).

This solution may have the advantage of increasing the twisting moment $T_y$ with a same actuation force.

Figure 3C:
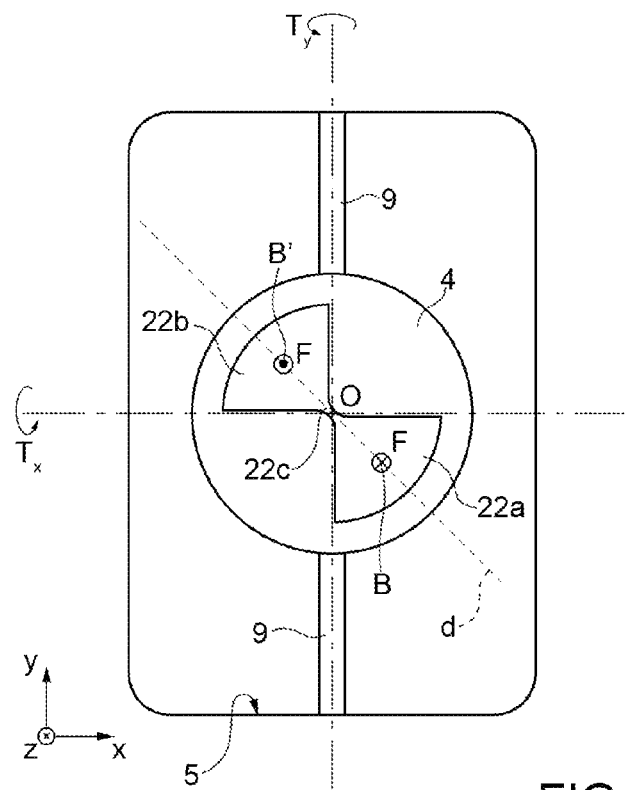

As shown in FIG. 3C, a further variant may envisage that the additional mass portions 22*a*, 22*b*, which in this case have a "quarter of a circle" conformation in the horizontal plane xy, are connected by a connecting portion 22*c* at the geometrical center O.

Figure 4:
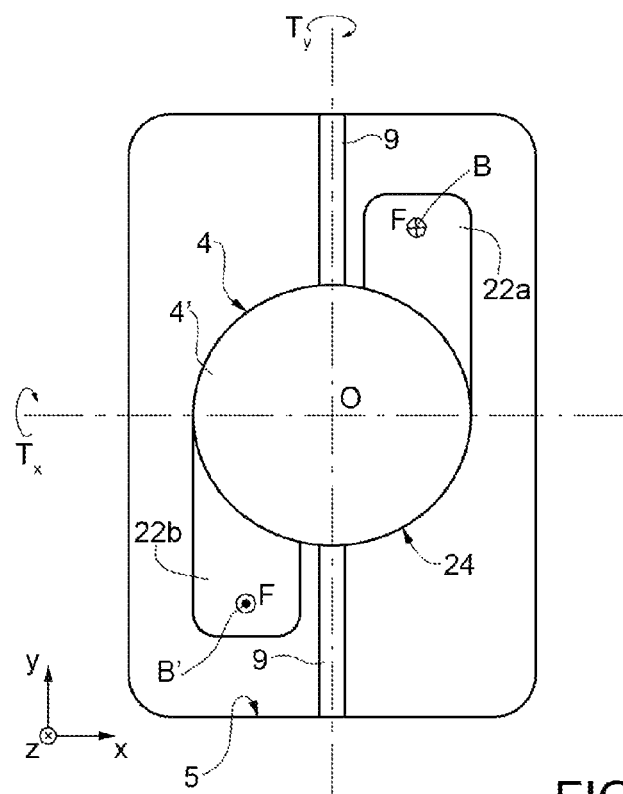
FIG. 4 is a schematic top plan view of the portion of the micromechanical structure, according to a different embodiment.

A further embodiment (see FIG. 4) envisages, instead, that the asymmetrical mass distribution of the mobile mass 4 is obtained by defining the same surface layer 24, in which the body portion of the same mobile mass 4 is formed, instead of defining a structural layer underlying the surface layer 24.

In this case, the additional mass portions 22*a*, 22*b* are defined starting from the surface layer 24 (thus being at the same level as the body portion of the mobile mass 4), extending symmetrically with respect to the geometrical center O and parallel to the second horizontal axis y, on opposite sides of the mobile mass 4 with respect to the first horizontal axis x. In this case, the additional mass portions 22*a*, 22*b* are coupled integrally to the mobile mass 4.

The above solution may offer the advantage of a simpler construction, given that it requires the processing of just one layer of semiconductor material (the aforesaid surface layer 24).

Irrespective of the configuration of the asymmetrical mass distribution associated to the mobile mass 4, the discussed inertial-coupling solution advantageously applies to any type of actuation envisaged to cause rotation of the frame 2 about the first horizontal axis x (i.e., of an electrostatic, electromagnetic, or piezoelectric type).

Figure 5A:
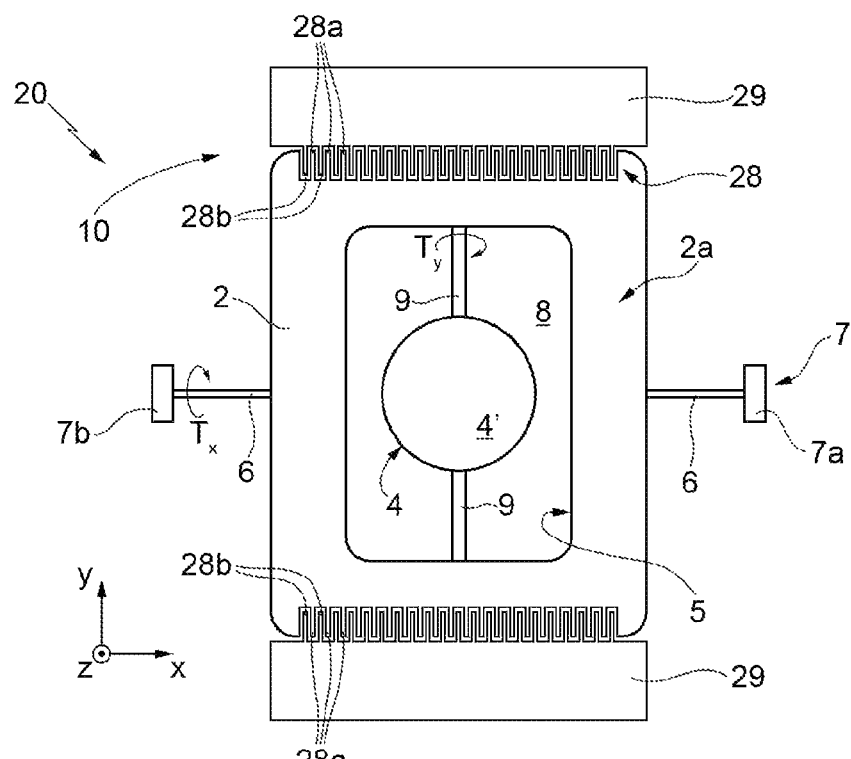
FIGS. 5A-5B are schematic top and, respectively, bottom, plan views of a micromechanical structure with biaxial actuation, having an actuation structure of an electrostatic type.
Figure 5B:
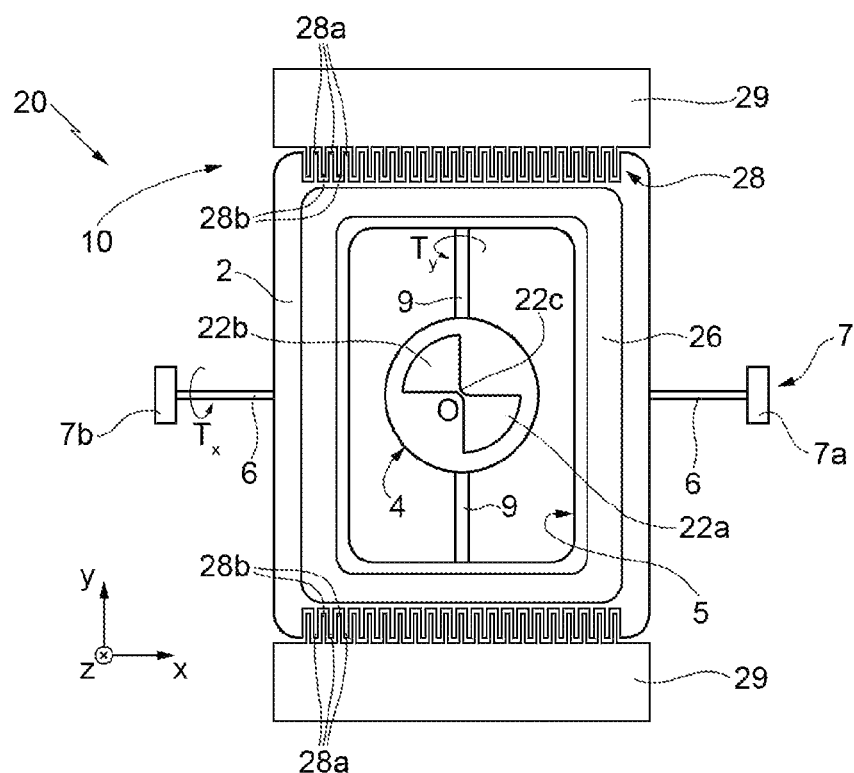

In this regard, FIGS. 5A and 5B are schematic illustrations of an embodiment of the actuation structure 10, coupled to the frame 2, being of an electrostatic type (in particular, FIG. 5B represents, purely by way of example, an asymmetrical mass distribution equivalent to the one described with reference to FIG. 3C).

In this case, the actuation structure 10 comprises a single set of comb-fingered electrodes 28 coupled to the frame 2, for generation of forces of electrostatic attraction such as to generate the twisting moment $T_x$ about the first horizontal axis x.

The set of comb-fingered electrodes 28 comprises: mobile electrodes 28*a* carried by the frame 2, in particular by portions of the frame 2 parallel to the first horizontal axis x (coupled to which are the second elastic elements 9); and fixed electrodes 28b, carried by a fixed structure 29, fixed with respect to the substrate 8 of the body of semiconductor material in which the reflector micromechanical structure 20 is obtained.

The mobile electrodes 28a and the fixed electrodes 28b extend parallel to one another and to the second horizontal axis y, and are comb-fingered in the horizontal plane xy and arranged at different heights along the vertical axis z.

In a per se known manner, the application of suitable driving signals to the mobile and fixed electrodes 28a, 28b enables generation of forces of electrostatic attraction for causing rotation of the frame 2 (and of the mobile mass 4) about the first axis x.

It is emphasized once again that, according to the present solution, just a single set of electrodes 28 may be used for actuation of the frame 2, exploiting the inertial coupling due to the asymmetrical distribution of mass associated to the mobile mass 4 for generation of the twisting moment $T_y$ that will cause rotation of the same mobile mass 4 about the second horizontal axis y (in other words, the present solution does not require the presence of electrodes coupled to the mobile mass 4 or to the second elastic elements 9).

Figure 6A:
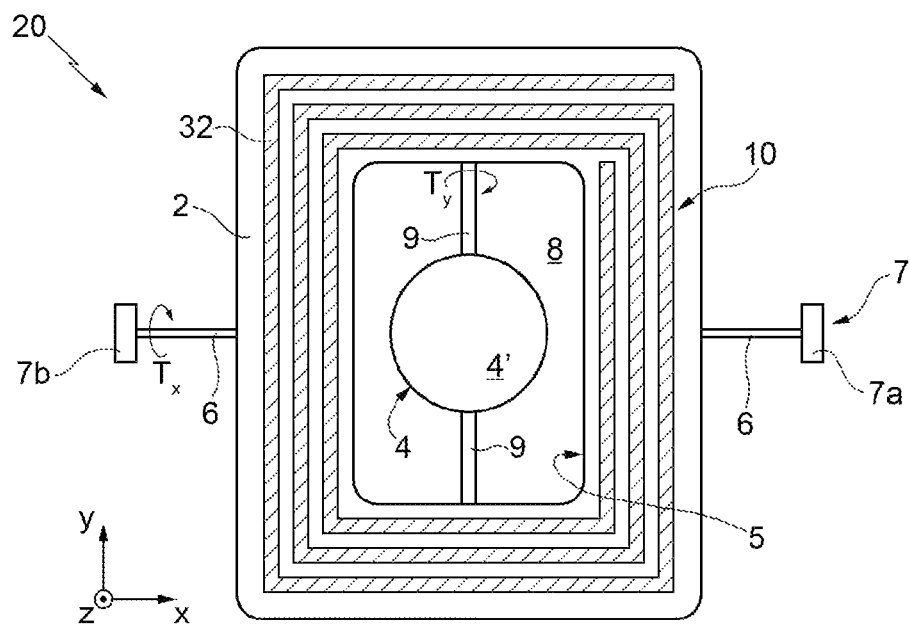
FIGS. 6A-6B are schematic top and, respectively, bottom, plan views of a micromechanical structure with biaxial actuation, having an actuation structure of an electromagnetic type.
Figure 6B:
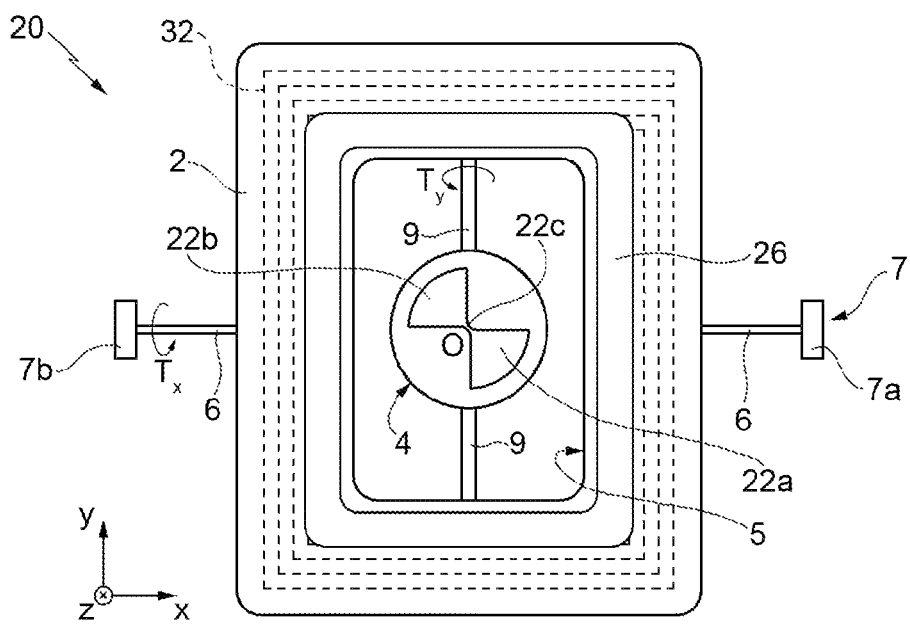

As shown in FIGS. 6A and 6B, in a different embodiment, of an electromagnetic type, the actuation structure 10 coupled to the frame 2 comprises a coil 32 arranged on the frame 2 (in the example, occupying an area having a square ring shape that extends along the entire perimeter of the same frame 2).

In a per se known manner, the movement of rotation of the frame 2 is in this case obtained starting from the Lorenz force, generated due to passage of an appropriate electric driving current through the coil 32.

Figure 7A:
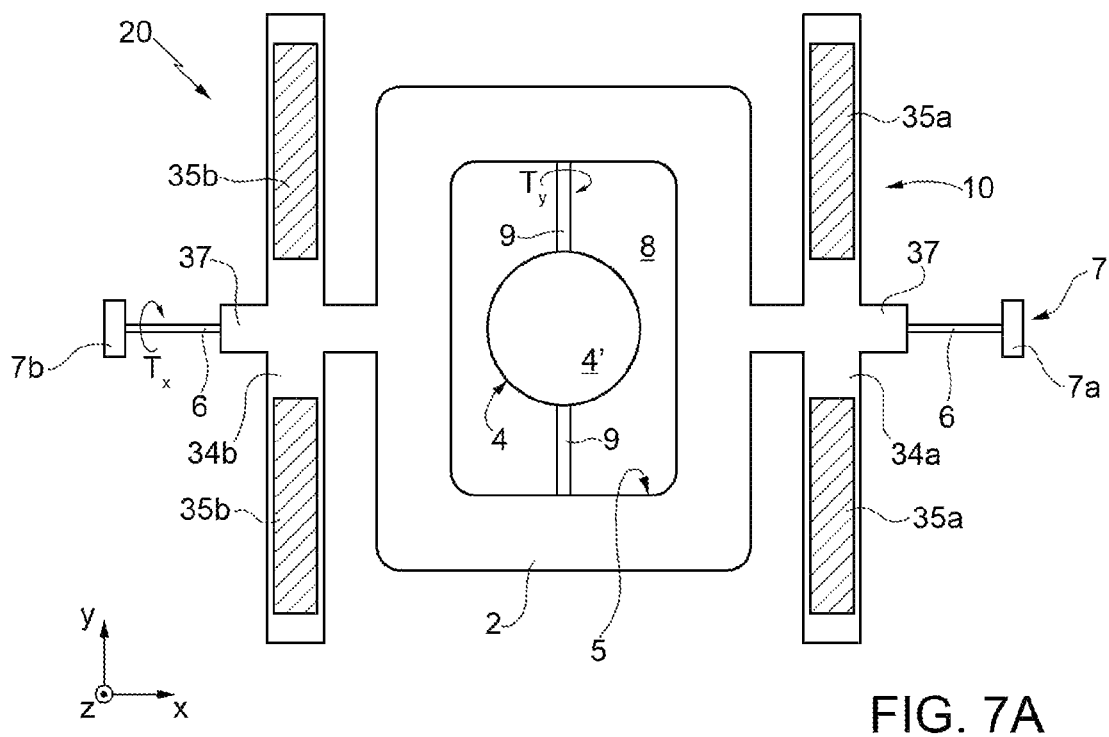
FIGS. 7A-7B are schematic top and, respectively, bottom, plan views of a micromechanical structure with biaxial actuation, having an actuation structure of a piezoelectric type.
Figure 7B:
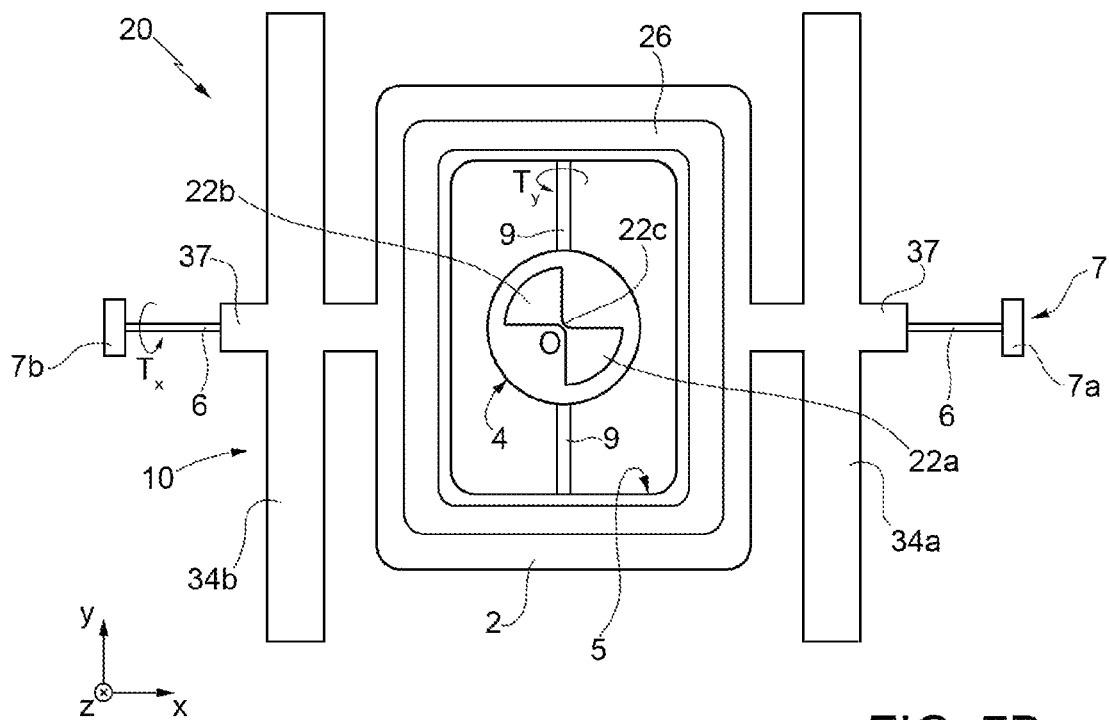

With reference to FIGS. 7A and 7B, a further embodiment of the actuation structure 10, this time of a piezoelectric type, envisages that the actuation structure 10 comprises a first thin-beam element 34a and a second thin-beam element 34b, which are mechanically connected to prolongations 37 of the frame 2, which extend along the first horizontal axis x, centrally and on opposite sides with respect to the frame 2.

The thin-beam elements 34a, 34b extend parallel to the second axis y (with a negligible extension along the vertical axis z) and carry respective piezoelectric actuators 35a, 35b.

In a per se known manner, application of suitable driving voltages to the aforesaid piezoelectric actuators 35a, 35b causes rotation of the thin beam elements 34a, 34b, and consequently of the frame 2, about the first horizontal axis x, with the consequent generation of the twisting moment $T_x$.

Also in this case, it is possible to use piezoelectric actuators 35a, 35b dedicated just to rotation about the first horizontal axis x, again exploiting the inertial coupling due to the asymmetrical mass distribution associated to the mobile mass 4 for generation of the twisting moment $T_y$ about the second horizontal axis y.

The advantages of the described solution emerge clearly from the foregoing discussion.

It is in any case emphasized that the inertial coupling due to the asymmetrical mass distribution associated to the mobile mass 4 of the reflector micromechanical structure 20 enables the possibility of using just one actuation structure, dedicated to the movement of the frame 2, for example its rotation about the first horizontal axis x, in any case obtaining a biaxial actuation of the mobile mass 4 thanks to the mass coupling.

The present solution enables maximization of the efficiency of actuation of the mobile mass 4 by virtue of the inertial force coupling to the frame 2.

It is further pointed out that the process used for the manufacture of the reflector micromechanical structure 20 does not envisage any substantial modifications with respect to traditional processes, envisaging the definition, with techniques that are known and already used for definition of the remaining structural elements, of a surface layer 24 and possibly of a structural layer 25, both already present in the reflector micromechanical structure 20.

The present solution may, moreover, be advantageously applied to a wide range of reflector micromechanical structures 20, for example ones that operate according to the principles of electrostatic, electromagnetic, or piezoelectric actuation, in which there is preferably present at least one resonant actuation movement.

The aforesaid features render use of the micromechanical structure particularly advantageous in integrated optical devices inside portable apparatuses.

Figure 8:
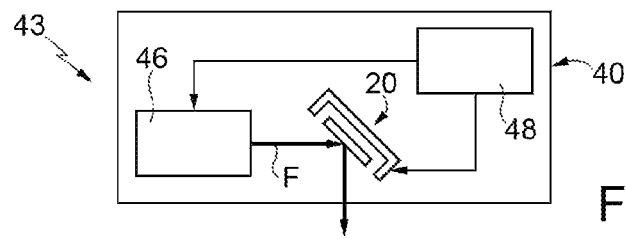
FIG. 8 is an overall block diagram of an optical MEMS device including the reflector micromechanical structure.

For instance, FIG. 8 represents schematically use of the reflector micromechanical structure 20 in a projector device 40 of a portable apparatus 43 (such as, for example, a smartphone).

In particular, the reflector micromechanical structure 20 is operable for projecting a light beam F generated by a light source 46, for example a coherent light source of a laser type, according to a desired scanning pattern.

The projector device 40 further comprises an electronic circuit 48, for control and driving, which is able to supply appropriate driving signals both to the light source 46 and to the reflector micromechanical structure 20 for varying the position and orientation thereof according to the desired scanning pattern for the reflected light beam.

Advantageously, the electronic circuit 48 may be obtained in an integrated technology using semiconductor techniques, possibly in the same die in which the reflector micromechanical structure 20 is provided.

Finally, it is clear that modifications and variations may be made to what has been described and illustrated herein, without thereby departing from the scope of the present invention, as defined in the annexed claims.

In particular, it is clear that the actual asymmetrical mass distribution associated to the mobile mass 4 of the reflector micromechanical structure 20 may differ from what has been illustrated hitherto, possibly also according to a different movement of actuation envisaged for movement of the frame 2 (and of the mobile mass 4, rigidly coupled to the frame 2 in its movement of actuation).

Figure 9A:
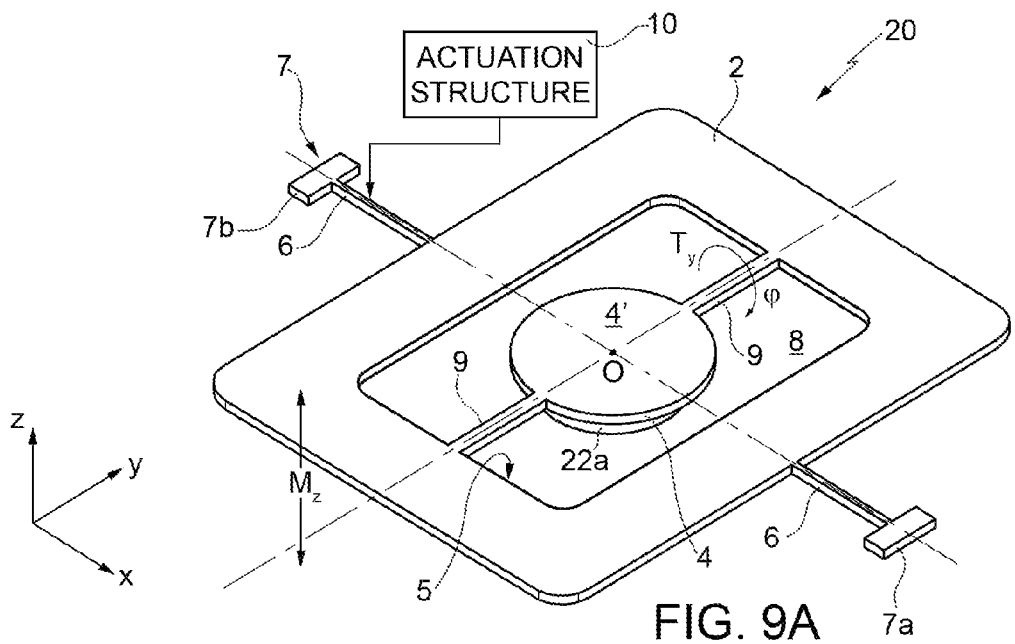
FIG. 9A is a schematic top perspective view of a micromechanical structure with biaxial actuation.

For instance, as shown in FIG. 9A, the frame 2 may be actuated by the corresponding actuation structure 10 (illustrated schematically) for obtaining a movement of actuation of translation along the vertical axis z (designated by $M_z$).

Figure 9B:
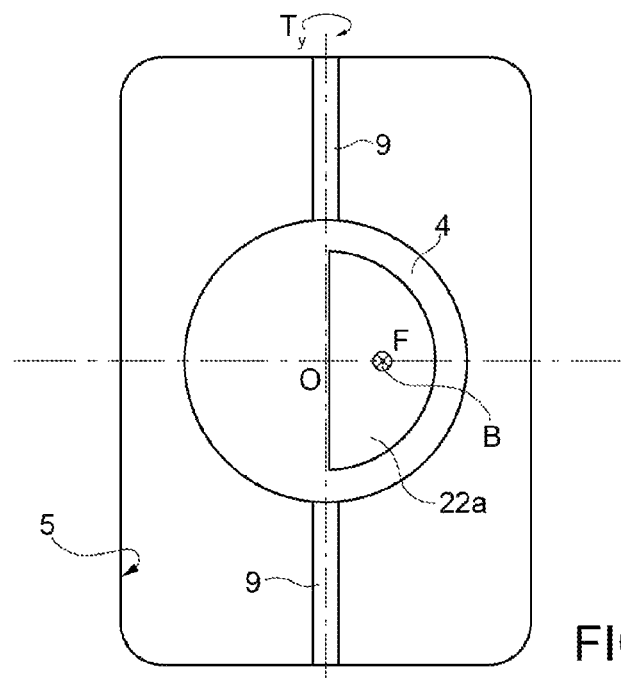
FIG. 9B is a schematic bottom plan view of a portion of the micromechanical structure of FIG. 9A.

In this case, as shown in FIG. 9B, the mass distribution associated to the mobile mass 4, which is asymmetrical with respect to the second horizontal axis y, may envisage a single additional mass portion 22a, having a semicircular shape in the horizontal plane xy, entirely arranged along one side of the second horizontal axis y (occupying, that is, the first and the second quadrants defined previously), with its centroid B arranged at a distance from the aforesaid second horizontal axis y.

As will be evident, the translation along the vertical axis z generates, by the inertial effect, the twisting moment $T_y$ and the consequent rotation of the mobile mass 4 about the second horizontal axis y.

Also for this specific embodiment, different asymmetrical mass distributions for the mobile mass 4 may be envisaged, provided that the single additional mass portion 22a has a centroid B arranged at a distance from the second horizontal axis y.

Furthermore, in the reflector micromechanical structure 20 an actuation structure for generating a movement of rotation of the mobile mass 4 about the second horizontal axis y may in any case be provided (in this case, the twisting moment $T_y$ generated as a result of the inertial coupling thus adding to this further movement of actuation, and in any case increasing the mechanical efficiency of the system).

The micromechanical structure described herein may in general be used in any MEMS device, for generating, with reduced occupation of space and high efficiency, rotation of a mobile mass about an axis of rotation following upon actuation of an actuator along, or about, an axis of actuation transverse to the same axis of rotation.

The invention claimed is:

1. A micromechanical structure with biaxial actuation, comprising:
    a frame including an internally defined window, said frame elastically connected by first elastic elements to an anchorage structure fixed with respect to a substrate;
    an actuation structure operatively coupled to said frame and configured to generate a first actuation movement of said frame with respect to a first actuation axis for said frame;
    a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass,
    a mass distribution associated to said mobile mass and being asymmetrical at least with respect to said second actuation axis and configured to generate, by an inertial effect as a function of said first actuation movement, a second actuation movement of rotation of the mobile mass about the second actuation axis; and
    wherein said mass distribution is configured to generate, in an equation of motion of said micromechanical structure, a mass matrix having terms of inertial coupling between the first actuation movement of said frame and the rotation of said mobile mass.

2. The micromechanical structure according to claim 1, wherein said mass distribution defines at least one centroid arranged at a distance from the second actuation axis at which an inertial force is originated in response to said first actuation movement so as to generate a twisting moment for rotation of said mobile mass about said second actuation axis.

3. The micromechanical structure according to claim 1, wherein said first elastic elements are of a torsional type and said first actuation axis defines a rotation axis, said first actuation movement being a rotation of said frame about said first actuation axis.

4. The micromechanical structure according to claim 3, wherein said first actuation axis and said second actuation axis define a horizontal plane parallel to a main surface of said frame; wherein said mobile mass has in said horizontal plane a geometrical center, and said mass distribution includes a first additional mass portion and a second additional mass portion arranged symmetrically with respect to said geometrical center and aligned in a diagonal direction which is inclined with respect to said first actuation axis and said second actuation axis.

5. The micromechanical structure according to claim 1, wherein said first actuation movement is a resonant movement, and said actuation structure operates on the basis of an operating principle chosen from: electrostatic; electromagnetic; and piezoelectric.

6. The micromechanical structure according to claim 1, wherein the mobile mass has a circular shape and a geometrical center and wherein said mass distribution includes a first additional mass portion and a second additional mass portion arranged symmetrically with respect to the geometrical center and aligned in a diagonal direction which is inclined with respect to said first actuation axis and said second actuation axis, said first and second additional mass portions each having a shape of a circular sector.

7. The micromechanical structure according to claim 6, wherein said first and second mass portions are joined by a connecting portion at the geometrical center.

8. A micromechanical structure with biaxial actuation, comprising:
    a frame including an internally defined window, said frame elastically connected by first elastic elements to an anchorage structure fixed with respect to a substrate;
    an actuation structure operatively coupled to said frame and configured to generate a first actuation movement of said frame with respect to a first actuation axis for said frame;
    a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass;
    a mass distribution associated to said mobile mass and being asymmetrical at least with respect to said second actuation axis and configured to generate, by an inertial effect as a function of said first actuation movement, a second actuation movement of rotation of the mobile mass about the second actuation axis;
    wherein said first elastic elements are of a torsional type and said first actuation axis defines a rotation axis, said first actuation movement being a rotation of said frame about said first actuation axis;
    wherein said first actuation axis and said second actuation axis define a horizontal plane parallel to a main surface of said frame;
    wherein said mobile mass has in said horizontal plane a geometrical center, and said mass distribution includes a first additional mass portion and a second additional mass portion arranged symmetrically with respect to said geometrical center and aligned in a diagonal direction which is inclined with respect to said first actuation axis and said second actuation axis; and
    wherein said mobile mass has in the horizontal plane a circular shape, and each of said first additional mass portion and said second additional mass portion have, in the horizontal plane, a shape of a circular sector and are joined by a connecting portion at the geometrical center.

9. The micromechanical structure according to claim 8 wherein said first actuation movement is a resonant movement, and said actuation structure operates on the basis of an operating principle chosen from: electrostatic and piezoelectric.

10. A micromechanical structure with biaxial actuation, comprising:

a frame including an internally defined window, said frame elastically connected by first elastic elements to an anchorage structure fixed with respect to a substrate;

an actuation structure operatively coupled to said frame and configured to generate a first actuation movement of said frame with respect to a first actuation axis for said frame;

a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass;

a mass distribution associated to said mobile mass and being asymmetrical at least with respect to said second actuation axis and configured to generate, by an inertial effect as a function of said first actuation movement, a second actuation movement of rotation of the mobile mass about the second actuation axis;

wherein said first elastic elements are of a torsional type and said first actuation axis defines a rotation axis, said first actuation movement being a rotation of said frame about said first actuation axis; and wherein said mobile mass comprises a body portion formed in a surface layer arranged at a distance from said substrate with respect to a vertical axis, which defines with the first actuation axis and the second actuation axis a set of three Cartesian axes; and said mass distribution includes at least one additional mass portion formed in a structural layer arranged underneath the surface layer with respect to said vertical axis in the direction of said substrate.

11. The micromechanical structure according to claim 10, wherein the mobile mass has a circular shape and a geometrical center and wherein said mass distribution includes a first additional mass portion and a second additional mass portion arranged symmetrically with respect to the geometrical center and aligned in a diagonal direction which is inclined with respect to said first actuation axis and said second actuation axis, said first and second additional mass portions each having a shape of a circular sector.

12. The micromechanical structure according to claim 11, wherein said first and second mass portions are joined by a connecting portion at the geometrical center.

13. A micromechanical structure with biaxial actuation, comprising:

a frame including an internally defined window, said frame elastically connected by first elastic elements to an anchorage structure fixed with respect to a substrate;

an actuation structure operatively coupled to said frame and configured to generate a first actuation movement of said frame with respect to a first actuation axis for said frame;

a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass;

a mass distribution associated to said mobile mass and being asymmetrical at least with respect to said second actuation axis and configured to generate, by an inertial effect as a function of said first actuation movement, a second actuation movement of rotation of the mobile mass about the second actuation axis;

wherein said first elastic elements are of a torsional type and said first actuation axis defines a rotation axis, said first actuation movement being a rotation of said frame about said first actuation axis; and wherein said mobile mass comprises a body portion formed in a surface layer arranged at a distance from said substrate with respect to a vertical axis that defines with the first actuation axis and the second actuation axis a set of three Cartesian axes; and said mass distribution includes at least one additional mass portion formed in said surface layer and coupled to said body portion.

14. The micromechanical structure according to claim 13 wherein said first actuation movement is a resonant movement, and said actuation structure operates on the basis of an operating principle chosen from: electrostatic and piezoelectric.

15. A MEMS device of an optical type, comprising:

a micromechanical structure with biaxial actuation, comprising:

a frame including an internally defined window, said frame elastically connected by first elastic elements to an anchorage structure fixed with respect to a substrate;

an actuation structure operatively coupled to said frame and configured to generate a first actuation movement of said frame with respect to a first actuation axis for said frame;

a mobile mass arranged within said window and elastically coupled by second elastic elements of a torsional type to said frame and configured so that said mobile mass is rigidly coupled to said frame in said first actuation movement and further defining a second actuation axis of a torsional type for said mobile mass, wherein said mobile mass carries a reflecting element, and a mass distribution associated to said mobile mass and being asymmetrical at least with respect to said second actuation axis and configured to generate, by an inertial effect as a function of said first actuation movement, a second actuation movement of rotation of the mobile mass about the second actuation axis;

a light source configured to generate a light beam incident on said reflecting element;

wherein biaxial actuation of said mobile mass generates a movement of said reflecting element for reflection of said light beam; and wherein said mobile mass has a geometrical center, and wherein said mass distribution includes a first additional mass portion and a second additional mass portion arranged symmetrically with respect to said geometrical center and aligned in a diagonal direction which is inclined with respect to said first actuation axis and said second actuation axis.

16. The MEMS device according to claim 15, further comprising an electronic circuit configured to supply driving signals to the light source and to the reflector micromechanical structure for generating a scanning pattern for the reflected light beam.

17. The MEMS device according to claim 15, wherein said mass distribution is configured to generate, in an equation of motion of said micromechanical structure, a mass matrix having terms of inertial coupling between the first actuation movement of said frame and the rotation of said mobile mass.

18. The MEMS device according to claim 15, wherein said mass distribution defines at least one centroid arranged at a distance from the second actuation axis at which an inertial force is originated in response to said first actuation movement so as to generate a twisting moment for rotation of said mobile mass about said second actuation axis.

19. The MEMS device according to claim 15, wherein said mobile mass comprises a body portion; and wherein said mass distribution includes at least one additional mass portion formed extending from a bottom of the body portion in a direction perpendicular to said first and second actuation axes.

20. The MEMS device according to claim 15, wherein said mobile mass comprises a body portion; and wherein said mass distribution includes at least one additional mass portion formed extending from a peripheral side of the body portion in a direction parallel to one of said first and second actuation axes.

21. The MEMS device according to claim 15, wherein said first actuation movement is a resonant movement, and said actuation structure operates on the basis of an operating principle chosen from: electrostatic; electromagnetic; and piezoelectric.

22. The MEMS device according to claim 15, wherein the mobile mass has a circular shape and a geometrical center and said first and second additional mass portions each have a shape of a circular sector.

23. The MEMS device according to claim 22, wherein said first and second mass portions are joined by a connecting portion at the geometrical center.

24. A micromechanical structure with biaxial actuation, comprising:
a frame including a window, said frame elastically connected to an anchorage structure by first elastic elements;
an actuation structure operatively coupled to said frame and configured to generate a first actuation movement of said frame with respect to a first actuation axis;
a mobile mass within said window and elastically coupled to said frame by second elastic elements defining a second actuation axis;
a mass distribution associated to said mobile mass in an asymmetrical manner with respect to said second actuation axis and configured to generate by the inertial effect in response to said first actuation movement a second actuation movement of rotation of the mobile mass about the second actuation axis; and
wherein said mobile mass has a geometrical center, and wherein said mass distribution includes a first additional mass portion and a second additional mass portion arranged symmetrically with respect to said geometrical center and aligned in a diagonal direction which is inclined with respect to said first actuation axis and said second actuation axis.

25. The micromechanical structure according to claim 24, wherein said mass distribution defines at least one centroid arranged at a distance from the second actuation axis at which an inertial force is originated in response to said first actuation movement so as to generate a twisting moment for rotation of said mobile mass about said second actuation axis.

26. The micromechanical structure according to claim 24, wherein said mobile mass comprises a body portion; and wherein said mass distribution includes at least one additional mass portion formed extending from a bottom of the body portion in a direction perpendicular to said first and second actuation axes.

27. The micromechanical structure according to claim 24, wherein said mobile mass comprises a body portion; and wherein said mass distribution includes at least one additional mass portion formed extending from a peripheral side of the body portion in a direction parallel to one of said first and second actuation axes.

28. The micromechanical structure according to claim 24, wherein the mobile mass has a circular shape and a geometrical center and said first and second additional mass portions each have a shape of a circular sector.

29. The micromechanical structure according to claim 28, wherein said first and second mass portions are joined by a connecting portion at the geometrical center.

* * * * *

UNITED STATES PATENT AND TRADEMARK OFFICE
CERTIFICATE OF CORRECTION

PATENT NO. : 9,864,187 B2
APPLICATION NO. : 15/162885
DATED : January 9, 2018
INVENTOR(S) : Roberto Carminati It is certified that error appears in the above-identified patent and that said Letters Patent is hereby corrected as shown below:

On the Title Page

Item (71), please correct the Applicant's name as follows:
Applicant: STMicroelectronics S.r.l., Agrate Brianza (IT)

Signed and Sealed this
Ninth Day of October, 2018

Andrei Iancu
*Director of the United States Patent and Trademark Office*